United States Patent [19]

Yoshimura

[11] Patent Number: 5,347,163
[45] Date of Patent: Sep. 13, 1994

[54] POWER SUPPLY BACKUP DEVICE FOR USE IN PORTABLE ELECTRONIC APPARATUS

[75] Inventor: Yutaka Yoshimura, Nara, Japan

[73] Assignee: Sharp Kabushiki Kaisha, Osaka, Japan

[21] Appl. No.: 827,948

[22] Filed: Jan. 31, 1992

[30] Foreign Application Priority Data

Feb. 4, 1991 [JP] Japan .................. 3-013524

[51] Int. Cl.⁵ .............................................. H02J 7/00
[52] U.S. Cl. ........................................ 307/66; 307/150
[58] Field of Search ..................... 307/64, 66, 150; 365/228, 229

[56] References Cited

U.S. PATENT DOCUMENTS

| | | | |
|---|---|---|---|
| 4,451,742 | 5/1984 | Aswell | 307/66 |
| 4,694,237 | 9/1987 | Hanson | 307/66 |
| 4,956,462 | 10/1990 | Crawford | 307/66 |
| 5,079,741 | 1/1992 | Kimura | 365/229 |
| 5,148,042 | 9/1992 | Nakazoe | 307/66 |
| 5,177,371 | 1/1993 | Faulk | 307/66 |

FOREIGN PATENT DOCUMENTS

| | | | |
|---|---|---|---|
| 0238921 | 11/1985 | Japan | 365/229 |
| 1151323 | 10/1989 | Japan | . |
| 1151324 | 10/1989 | Japan | . |
| 404087533 | 3/1992 | Japan | 365/229 |

Primary Examiner—Jeffrey A. Gaffin
Attorney, Agent, or Firm—David G. Conlin; Peter F. Corless

[57] ABSTRACT

The present invention provides a power supply backup device for a portable electronic apparatus having a main battery and an auxiliary battery for supplying power when a voltage of the main battery drops. The power supply backup device comprises a backup battery for supplying power at a time of an exchange of at least one of the main battery and the auxiliary battery, a mechanism for detecting a removal of the main battery and the auxiliary battery respectively from the apparatus, and a mechanism for switching over a circuit for connecting the backup battery with the apparatus so as to supply power from the backup battery when the detecting mechanism detects the removal of at least one of the main battery and the auxiliary battery.

4 Claims, 3 Drawing Sheets

POWER SUPPLY BACKUP DEVICE FOR USE IN PORTABLE ELECTRONIC APPARATUS

BACKGROUND OF THE INVENTION

1. Field of the Invention

The present invention relates to a power supply backup device used for a RAM included in portable electronic apparatus such as an electronic notebook.

2. Description of the Related Art

Portable electronic apparatus such as an electronic notebook or the like generally contains a main battery as a main power supply and an auxiliary battery as an auxiliary power supply. Usually power is supplied from the main battery to a nonvolatile memory for storing data, etc. Then, if the main battery goes wrong or when the power supply capability of the main battery comes down by consumption, the power supply path is switched to the auxiliary battery. In this case, the consumption or abnormality of the main battery is detected by sensing a voltage drop of the main battery below a specified value.

In an electronic appliance arranged as described, when the main battery or the auxiliary battery are replaced with new one if both are dismounted simultaneously by mistake, the power supply to the RAM is discontinued, so that data in the RAM will be lost. To prevent a data loss accident such as this, there is conventionally provided a mechanism which prevents simultaneous dismounting of the main battery and the auxiliary battery. The appliance needs to be provided with a battery change switch, a battery cover, a battery detection pin or the like, and therefore a scheme of preventing loss of data by this kind of mechanism results in an complicated construction of the appliance.

SUMMARY OF THE INVENTION

It is therefore an object of the present invention to provide a power supply backup device for a portable electronic apparatus, having a simple structure and being capable of backing up a nonvolatile memory.

A power supply backup device according to the invention comprises a backup battery for supplying power at time of an exchange of at least one of a main battery and an auxiliary battery, mechanism for detecting a removal of the main battery and the auxiliary battery respectively from the apparatus, and mechanism for switching over a circuit for connecting the backup battery with the apparatus so as to supply power from the backup battery when the detecting mechanism detects the removal of at least one of the main battery and the auxiliary battery.

In operation, if the main battery or/and the auxiliary battery is removed, the situation is detected by the detecting mechanism and the circuit is switched by the switching mechanism in such a way that the backup battery supplies power to the portable electronic apparatus. Therefore, the power supply to the apparatus can be continued and a loss of data in the nonvolatile memory in the apparatus can be prevented reliably, even if the adequate power supply from the main battery or/and the auxiliary battery is stopped by trouble or consumption.

In a preferred embodiment the switching mechanism includes a first switch which turns on when the main battery is removed and turns off when the main battery is mounted, and a second switch which turns on when the auxiliary battery is removed, and turns off when the auxiliary battery is mounted.

Both the first switch and the second switch may include a pin which is moved when the corresponding battery is removed or mounted and a switch contact which is associated with the pin, respectively.

The switching mechanism may include a single switch which turns on when the auxiliary battery is removed and turns off when the auxiliary battery is mounted.

Further objects and advantages of the present invention will be apparent from the following description of the preferred embodiments of the invention as illustrated in the accompanying drawings.

DESCRIPTION OF THE PREFERRED EMBODIMENT

Figure 1:
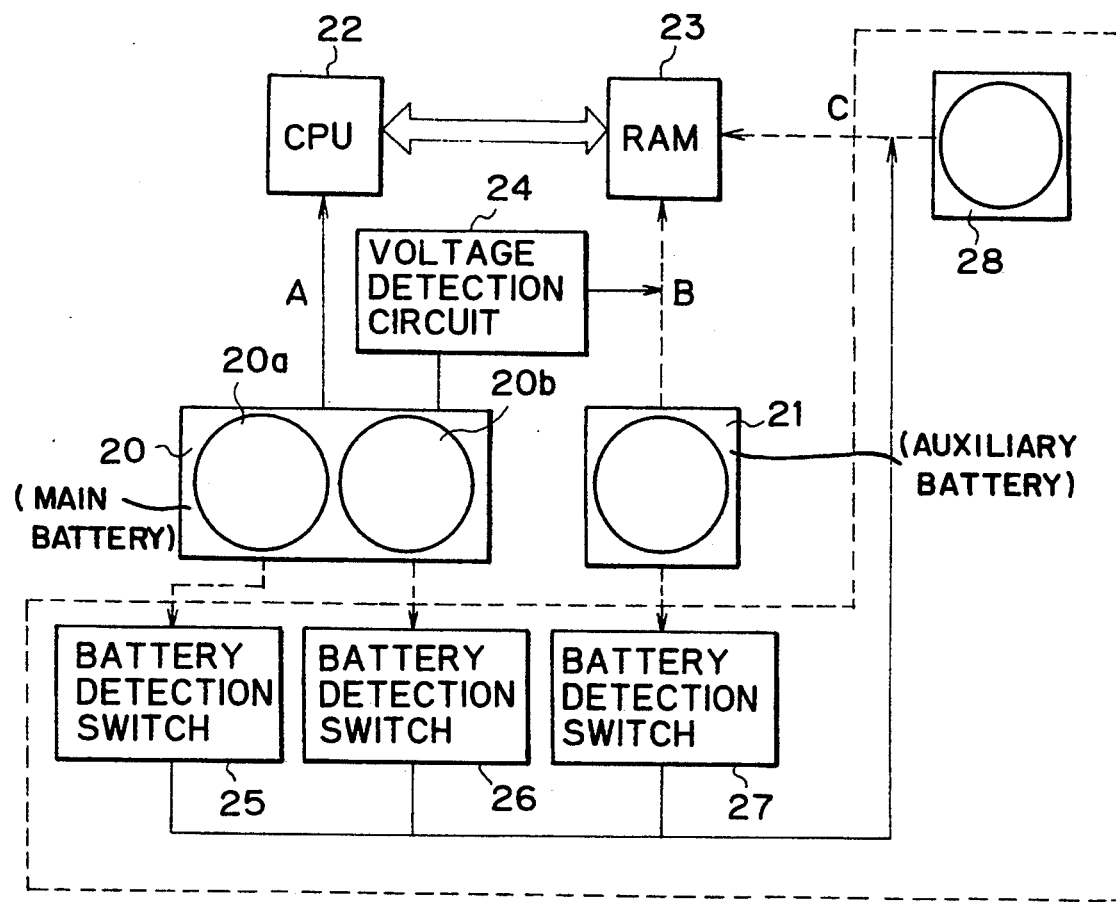
FIG. 1 is a schematic representation of a power supply circuit configuration of a power supply backup device according to the present invention.

FIG. 1 is a block diagram schematically showing a configuration of a power supply circuit of portable electronic apparatus according to an embodiment of the present invention. In FIG. 1, reference numeral 20 denotes a main battery constituting the main power supply; 21 an auxiliary battery constituting the auxiliary power supply; 22 a CPU; 23 a RAM; and 24 a circuit for detecting a voltage of the main battery 20. The main battery 20 is composed of a battery 20a and a battery 20b. The storage sections, which are used for the battery 20a, battery 20b, and auxiliary battery 21, are provided with battery detection switches 25, 26 and 27 respectively. Those battery detection switches 25, 26 and 27 are mechanical switches so as to be off when the corresponding battery exist in the corresponding storage section, and on when the batteries are removed from the storage sections. The battery detection switches 25, 26 and 27 are inserted and connected between a backup battery 28, which is used for power supply at time of battery exchange, and RAM 23.

Figure 2:
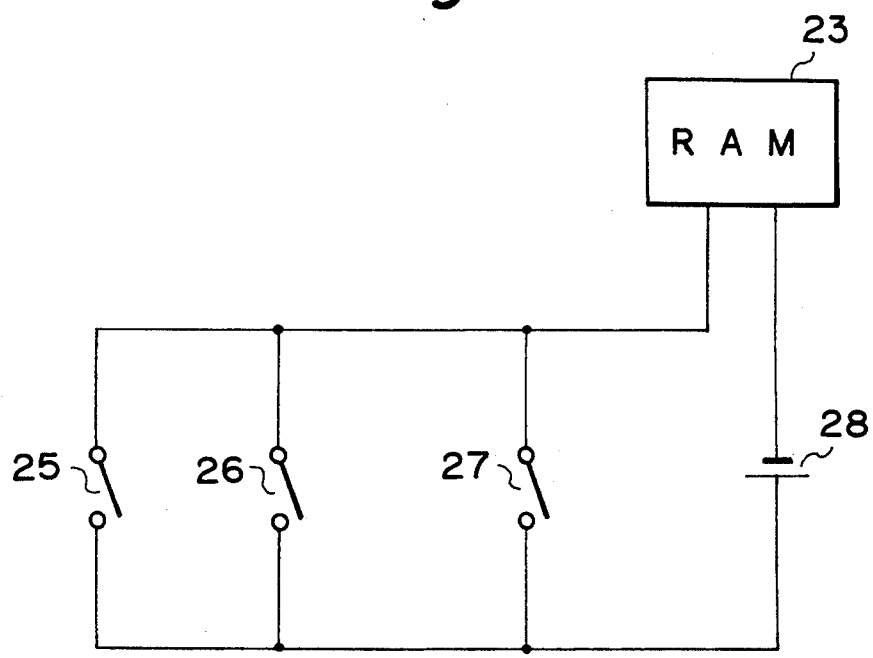
FIG. 2 is a schematic representation of a part of the power supply circuit configuration in FIG. 1.

FIG. 2 is a wiring diagram showing that part of the circuit configuration which includes the RAM 23, battery detection switches 25, 26 and 27 and the backup battery 28. The battery detection switches 25, 26 and 27 are connected in parallel with one another between the backup battery 28 and the RAM 23.

As shown in FIG. 1, normally, power is supplied through route A from the main battery 20 to a circuit including a CPU 22. When the voltage of the main battery 20 drops below a specified value, this is detected by the voltage detection circuit 24, power is supplied from the auxiliary battery 21 through route B to the RAM 23 to back up the data in the RAM 23. As described above, when batteries are mounted in the respective storage sections, the battery detection switches 25, 26 and 27 are off, which state is shown in FIG. 2.

When the main battery 20 or the auxiliary battery 21 or both need to be replaced for new one, the user removes the batteries from the storage sections. If any one battery is removed, the corresponding battery detection switch turns on, with the result that power is supplied from the backup battery 28 to the RAM 23, thus backing up the data in the RAM 23.

Figure 3A:
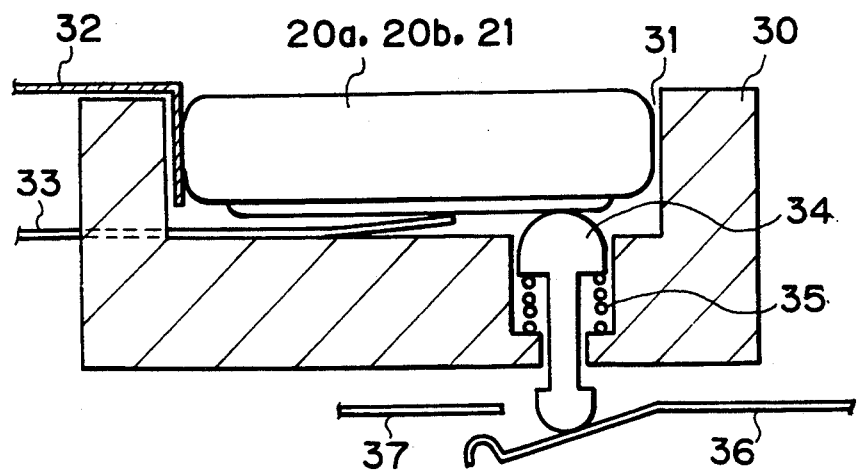
FIG. 3A and FIG. 3B each is a schematic representation of an arrangement of a battery storage section and a battery detection switch shown in FIG. 1.

FIG. 3A is a cross-sectional view of the arrangement of a storage section for the main battery 20a or 20b or the auxiliary battery 21 and the battery detection switch. In FIG. 3A, reference numeral 30 denotes a housing; 31 denotes a storage section for the main battery 20a or 20b or the auxiliary battery 21; 32 and 33 denote contact terminals which come into contact with electrodes of the battery; 34 denotes a battery detection pin; 35 denotes a coil spring for pushing the battery detection pin 34; and both 36 and 37 denote switch contacts and the switch contact 36 is driven by the battery detection pin 34.

The battery (main battery 20a or 20b or auxiliary battery 21) is contained in the storage section 31 in the housing 30. The positive terminal of the battery is connected to the positive contact terminal 32, while the negative terminal is connected to the negative contact terminal 33. One end of the battery detection pin 34 presses the underside of the battery in the storage section 31 by a force of the coil spring 35 while the battery is mounted in. On the other hand the opposite end of the battery detection pin 34 abuts and pushes down the switch contact 36, leaving it from the switch contact 37. The battery detection switch is composed of the battery detection pin 34 and the switch contact 36 and 37.

Therefore, as shown in FIG. 3A, in the condition that the battery is mounted in the storage section 31, the battery detection pin 34 is pushed down, depressing the switch contact 36 downward. Then the switch contact 36 separates from the switch contact 37, turning off the battery detection switch. In the normal condition that all batteries are mounted in the storage sections respectively and the battery detection switches are all off, current does not flow in the circuit in FIG. 2.

Figure 3B:
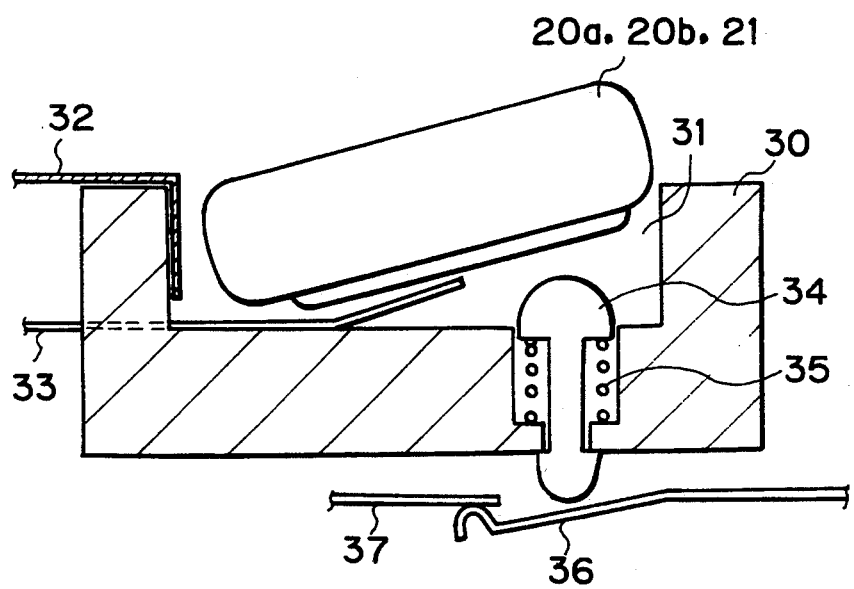

In contrast, in the condition that the battery is detached from the storage section as shown in of FIG. 3B, the battery detection pin 34 is pushed up by the force of the coil spring 35, allowing the switch contact 36 to come into contact with the switch contact 37, thus turning on the battery detection switch. Thus, when any one of the battery detection switches is turned on as the battery is removed, a current flows in the circuit of FIG. 2, supplying a backup power to the RAM 23.

The arrangement of the battery detection pin 34 and the coil spring 35 or the like in this embodiment corresponds to detecting mechanism in the present invention, while the battery detection switches 25, 26 and 27 correspond to switching mechanism in the present invention.

In the above-mentioned embodiment, three battery detection switches 25, 26 and 27 are provided to detect the replacement of a battery or batteries. However, it is possible to make such an arrangement that the main battery is supplemented solely by the auxiliary battery 21, and the backup battery is enabled only when the auxiliary battery 21 is removed.

As has been described, according to the present invention, a power supply backup device used for portable electronic equipment comprises detecting mechanism for detecting the removal of a main battery or an auxiliary battery from the apparatus, the backup battery, and mechanism for switching the circuit so as to keep the power supply to the RAM. Therefore, a loss of data in the RAM can be prevented reliably by a simple arrangement without using no complicated mechanism.

Many widely different embodiments of the present invention may be constructed without departing from the spirit and the scope of the present invention. It should be understood that the present invention is not limited to the specific embodiments described in the specification, except as defined in the appended claims.

What is claimed is:

1. A power supply backup device used for a portable electronic apparatus having a main battery and an auxiliary battery, comprising:

a backup battery for supplying power to said portable electronic apparatus at a time of exchange of at least one of said main battery and said auxiliary battery;

means for detecting a physical removal of said main battery and said auxiliary battery respectively from said apparatus; and means for switching over a circuit for connecting said backup battery with said apparatus so as to supply power from said backup battery when said detecting means detects the removal of at least one of said main battery and said auxiliary battery.

2. A power supply backup device according to claim 1, wherein said switching means includes a first switch which turns on when said main battery is removed from a first storage accommodating said main battery and turns off when said main battery is mounted in said first storage, and a second switch which turns on when said auxiliary battery is removed from a second storage accommodating said auxiliary battery, and turns off when said auxiliary battery is mounted in said second storage.

3. A power supply backup device according to claim 2, wherein each of said first and second switches includes a pin disposed in a corresponding storage and a switch contact engaging with said pin, said pin being pushed down thereby to push down the switch contact so as to electrically disconnect said backup battery from said apparatus when a corresponding battery is mounted in the storage, said pin being pushed up by a spring force thereby to push up the switch contact so as to electrically connect said backup battery with said apparatus when a corresponding battery is detached from the storage.

4. A power supply backup device used for a portable electronic apparatus having a main battery and an auxiliary battery, comprising:

a backup battery for supplying power to said portable electronic apparatus at a time of exchange of at least one of said main battery and said auxiliary battery;

a first switch mechanically actuated by mounting said main battery in a first storage and removing said main battery from the first storage; and a second switch mechanically actuated by mounting said auxiliary battery in a second storage and removing said auxiliary battery from the second storage, each of said first and second switches including a pin disposed in a corresponding storage and a switch contact engaging with said pin, said pin being pushed down thereby to push down the switch contact so as to electrically disconnect said backup battery from said apparatus when a corresponding battery is mounted in the storage, said pin being pushed up by a spring force thereby to push up the switch contact so as to electrically connect said backup battery with said apparatus when a corresponding battery is detached from the storage.

* * * * *